United States Patent
Hwang

(10) Patent No.: US 9,832,884 B2
(45) Date of Patent: Nov. 28, 2017

(54) CONDUCTIVE BALL MOUNTING DEVICE

(71) Applicant: SAMSUNG ELECTRO-MECHANICS CO., LTD., Suwon-Si (KR)

(72) Inventor: Chi Won Hwang, Suwon-Si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 320 days.

(21) Appl. No.: 14/607,070

(22) Filed: Jan. 27, 2015

(65) Prior Publication Data

US 2015/0264818 A1 Sep. 17, 2015

(30) Foreign Application Priority Data

Mar. 17, 2014 (KR) .................. 10-2014-0031116

(51) Int. Cl.
| | |
|---|---|
| H05K 3/34 | (2006.01) |
| B23K 3/06 | (2006.01) |
| H05K 1/18 | (2006.01) |
| H05K 3/12 | (2006.01) |

(52) U.S. Cl.
CPC .......... *H05K 3/3478* (2013.01); *B23K 3/0623* (2013.01); *H05K 1/18* (2013.01); *H05K 3/1233* (2013.01); *H05K 2203/0126* (2013.01); *H05K 2203/041* (2013.01); *Y10T 29/532* (2015.01); *Y10T 29/53183* (2015.01); *Y10T 29/53191* (2015.01)

(58) Field of Classification Search
CPC .. B23K 3/0623; H05K 3/1233; H05K 3/3478; H05K 1/18; H05K 2203/041; H05K 2203/0126; Y10T 29/53183; Y10T 29/53191; Y10T 29/532

See application file for complete search history.

(56) References Cited

U.S. PATENT DOCUMENTS

| | | | | |
|---|---|---|---|---|
| 5,623,872 | A | 4/1997 | Tomomatsu | |
| 6,176,008 | B1 * | 1/2001 | Ueoka | B23K 3/0623 228/180.22 |
| 6,352,189 | B1 * | 3/2002 | Kobayashi | B23K 3/0623 228/246 |
| 2007/0130764 | A1 * | 6/2007 | Nebashi | B23K 3/0623 29/843 |
| 2009/0108053 | A1 * | 4/2009 | Huddleston | B23K 3/0623 228/246 |
| 2010/0044413 | A1 * | 2/2010 | Kajii | B23K 1/0016 228/41 |

FOREIGN PATENT DOCUMENTS

JP       2003069207 A  *  3/2003  ........... B23K 3/0623

* cited by examiner

*Primary Examiner* — A. Dexter Tugbang
(74) *Attorney, Agent, or Firm* — NSIP Law

(57) ABSTRACT

A conductive ball mounting device is provided. The conductive ball mounting device includes: a mask having a thickness equal to or larger than a diameter of a conductive ball and having an opening formed therein, wherein the conductive ball is absorbed and desorbed into and from the opening; a frame having a vacuum hole formed therein and formed to enclose sides and an upper portion of the mask; and a porous member formed between the frame and the upper portion of the mask.

8 Claims, 3 Drawing Sheets

CONDUCTIVE BALL MOUNTING DEVICE

CROSS REFERENCE TO RELATED APPLICATION

This application claims the benefit of Korean Patent Application No. 10-2014-0031116, filed on Mar. 17, 2014, entitled "Conductive Ball Mounting Device", which is hereby incorporated by reference in its entirety into this application.

BACKGROUND OF THE INVENTION

1. Technical Field

The present invention relates to a conductive ball mounting device.

2. Description of the Related Art

A printed circuit board (PCB) serves to simply connect various electronic components to each other along a predetermined frame and is widely used for all electronic products from home appliances including a digital TV to high-tech communications devices.

A solder paste in a melted state is applied on the PCB in a predetermined pattern so that various small electronic components such as a semiconductor chip may be mounted on the PCB. Here, as a method of applying the solder paste, a screen printer method is widely used, wherein the screen printer method is performed by a solder paste applying apparatus. The screen printer presses the solder paste supplied on a metal mask having an opening of a specific pattern by a squeegee and applies the pressed solder paste on a component mounting surface.

However, as the PCB becomes large, a matching degree between the PCB and the mask is consequently low due to a warpage phenomenon or deformation by a ratio of expansion and contraction generated during a manufacturing process, whereby defects may occur.

PRIOR ART DOCUMENT

Patent Document (Patent Document 1) U.S. Pat. No. 5,623,872

SUMMARY OF THE INVENTION

The present invention has been made in an effort to provide a conductive ball mounting device capable of improving a matching degree between a pad of a board and a conductive ball.

According to a preferred embodiment of the present invention, there is provided a conductive ball mounting device including: a mask having a thickness equal to or larger than a diameter of a conductive ball and having an opening formed therein, wherein the conductive ball is absorbed and desorbed into and from the opening; a frame having a vacuum hole formed therein and formed to enclose sides and an upper portion of the mask; and a porous member formed between the frame and the upper portion of the mask.

The frame may include: an upper frame positioned on the mask; and a side frame positioned at the side of the mask and having an upper half coupled to the upper frame to support the upper frame.

The conductive ball mounting device may further include a fixing member penetrating through the upper frame in a thickness direction and fixing the upper frame and the side frame in a state in which they are coupled to each other by inserting one end penetrating through the upper frame into the upper half of the side frame.

A height of the frame may be changed depending on an insertion length of the side frame inserted into the upper frame.

The conductive ball mounting device may further include a mask frame having one side coupled to the side frame and the other side coupled to the side of the mask to connect the mask and the frame to each other.

The mask frame may be moved along the coupled side frame.

The mask may have elasticity.

The mask may be made of a metal material having elasticity.

The porous member may be fixed on a lower surface of the upper frame and be in contact with an upper surface of the mask.

The opening may have a width and a depth equal to or larger than the diameter of the conductive ball.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
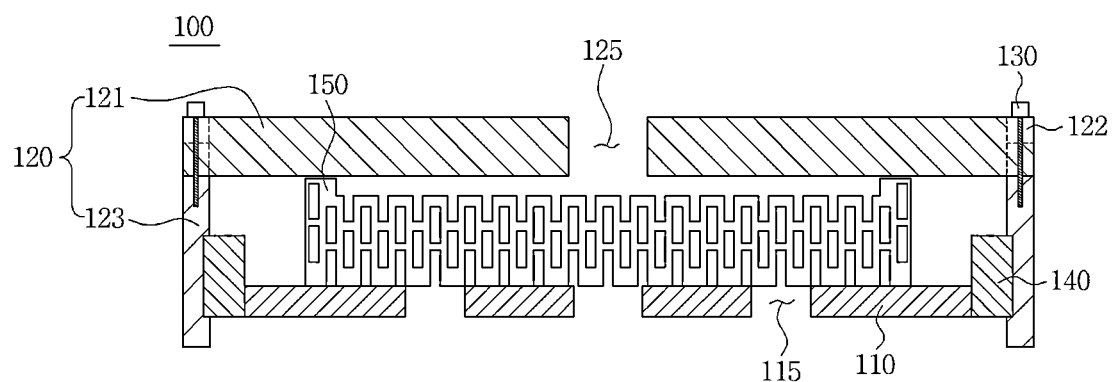
FIGS. 1 and 2 are illustrative views for a conductive ball mounting device according to a preferred embodiment of the present invention.

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first", "second", "one side", "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, a preferred embodiment of the present invention will be described in detail with reference to the accompanying drawings.

Figure 2:
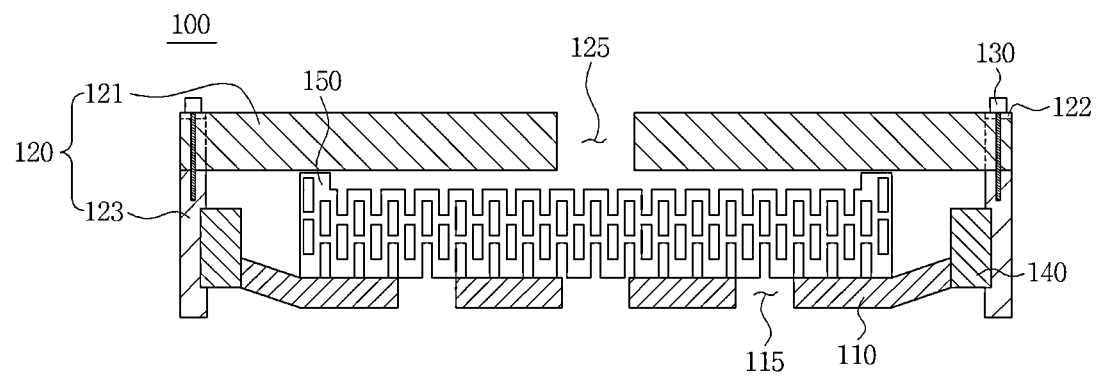

FIGS. 1 and 2 are illustrative views for a conductive ball mounting device according to a preferred embodiment of the present invention.

A conductive ball mounting device 100 according to a preferred embodiment of the present invention is a device for mounting a conductive ball on a board.

Referring to FIG. 1, the conductive ball mounting device 100 may include a mask 110, a frame 120, a fixing member 130, a mask frame 140, and a porous member 150.

According to a preferred embodiment of the present invention, the mask 110 may be formed to have a thickness of a diameter or more of a conductive ball (not shown). That is, the thickness of the mask 110 may be equal to or larger than the diameter of the conductive ball. In addition, the mask 110 may have an opening 115 formed therein, wherein the conductive ball is inserted and absorbed into the opening 115 and the inserted conductive ball is desorbed from the opening 115. That is, the conductive ball may be moved to an upper portion of a board (not shown) in a state in which it is absorbed into the opening 115 of the mask 110 and may be then desorbed from the opening 115 of the mask 110 to thereby be mounted on the board. According to the preferred embodiment of the present invention, the opening 115 may have a size equal to or larger than that of the conductive ball. That is, the opening 115 may have a width and a depth equal to or larger than the diameter of the conductive ball. Therefore, when the conductive ball is inserted and absorbed into the opening 115 of the mask 110, it may not be protruded to the outside of the mask 110.

According to the preferred embodiment of the present invention, a position of the opening 115 formed in the mask 110 may correspond to a mounting position of the conductive ball on the board when the mask 110 is positioned over the board.

In addition according to the preferred embodiment of the present invention, the mask 110 may be formed to have elasticity. For example, the mask 110 may be made of a metal material having elasticity. However, the material of the mask 110 is not limited to the metal, but any material among known materials used as the mask of the board may be used as long as it has elasticity.

According to the preferred embodiment of the present invention, the frame 120 may be formed to enclose sides and an upper portion of the mask 110. In addition, the frame 120 may have a vacuum hole 125 formed therein.

The frame 120 according to the preferred embodiment of the present invention may include an upper frame 121 and a side frame 123.

The upper frame 121 may be disposed to be spaced apart from an upper surface of the mask 110 to cover the upper portion of the mask 110.

In addition, the upper frame 121 may have the vacuum hole 125 formed therein. The vacuum hole 125 may exhaust gas in an inner space of the frame 120 to allow the conductive ball to be absorbed into the opening 115 of the mask 110. In addition, the vacuum hole 125 may inhale external gas into the inner space of the frame 120 to allow the conductive ball absorbed into the mask 110 to be desorbed. For example, the vacuum hole 125 may be connected to an external device (not shown) such as a vacuum pump for the exhaust and the inhalation described above.

In addition, the upper frame 121 may have an insertion groove 122 formed therein, wherein a portion of the side frame 123 may be inserted into the insertion groove 122. Although FIG. 1 shows a case in which the insertion groove 122 is formed in the side of the upper frame 121, the insertion groove 122 may be formed along an edge of the upper frame 121.

The side frame 123 may be disposed on the side of the mask 110. In addition, the side frame 123 may be coupled to the upper frame 121 to support the upper frame 121.

A portion of an upper half of the side frame 123 may be inserted into the insertion groove 122 of the upper frame 121, such that the upper frame 121 and the side frame 123 may be coupled to each other. In addition, an insertion length between the insertion groove 122 of the upper frame 121 and the side frame 123 may be adjusted. As such, a height of the frame 120 may be changed depending on the insertion length of the side frame 123.

The fixing member 130 according to the preferred embodiment of the present invention may fix the upper frame 121 and the side frame 123. For example, the fixing member 130 may penetrate through the upper frame 121 in a thickness direction. In this case, one end of the fixing member 130 penetrating through the upper frame 121 may be inserted into the upper half of the side frame 123 inserted into the upper frame 121. The upper frame 121 and the side frame 123 may be fixed in a state in which they are coupled to each other by the fixing member 130 described above. Although not shown in FIG. 1, the upper frame 121 and the side frame 123 may have a groove (not shown) formed therein, wherein the fixing member 130 may be inserted into the groove. For example, the fixing member 130 may be a screw. However, a kind of fixing member 130 is not limited to the screw, but it may include any fixing member as long as it may fix the upper frame 121 and the side frame 123 in a state in which they are coupled to each other without being separated from each other.

The mask frame 140 according to the preferred embodiment of the present invention may connect the mask 110 and the side frame 123 to each other. One side of the mask frame 140 may be coupled to the side frame 123 and the other side thereof may be coupled to the side of the mask 110. According to the preferred embodiment of the present invention, the mask frame 140 may be moved along the side frame to which it is coupled. For example, the mask frame 140 may be slid-coupled to the side frame 123 to vertically move along the side frame 123. In addition, after the mask frame 140 is moved, it may be fixed at the moved position by a fixing screw. A method in which the mask frame 140 is coupled to the side frame 123 and the mask 110 is not limited thereto, any one of known methods capable of coupling the two configurations may be used.

The porous member 150 according to the preferred embodiment of the present invention may be formed between the frame 120 and the upper portion of the mask 110. The porous member 150 may have gaps such as apertures formed therein and any porous member capable of maintaining an interval between the frame 120 and the mask 110 may be used.

An upper surface of the porous member 150 may be fixed on a lower surface of the upper frame 121. Although FIG. 1 shows a case in which only a portion of the upper surface of the porous member 150 is fixed on the lower surface of the upper frame 121, the present invention is not limited thereto. For example, the entire upper surface of the porous member 150 may be fixed on the lower surface of the upper frame 121. In addition, the lower surface of the porous member 150 may be in contact with or closely adhered to the upper surface of the mask 110. For example, the upper surface of the mask 110 contacting the porous member 150 may be an upper surface of a region including all openings 115.

The upper frame 121 and the mask 110 may maintain a predetermined spaced distance by the porous member 150 formed as described above. For example, as shown in FIG. 2, the side frame 123 may be further inserted into the upper frame 121 or the mask frame 140 may be moved in an upper direction. In this case, the position of the mask 110 contacting the porous member 150 may not be changed by the porous member 150.

According to the preferred embodiment of the present invention, the porous member 150 may deliver vacuum force generated when the gas in the frame 120 is exhausted through the vacuum hole 125 to the mask 110. The conductive ball may be inserted and absorbed into the opening 115 of the mask 110 by the vacuum force delivered to the mask 110 by the porous member 150. In addition, in the case in which the porous member 150 and the mask 110 are separated from each other, the mask 110 may also be closely adhered to the porous member 150 by the vacuum force delivered to the mask 110.

According to the preferred embodiment of the present invention, in the conductive ball mounting device 100, since the size of the opening 115 of the mask 110 is larger than the size of the conductive ball, the board and mask 110 may be directly in contact with each other when the conductive ball is mounted on the board. In addition, when the board and the mask 110 are directly in contact with each other, rigidity of the mask 110 is reinforced by the porous member 150, such that load may be applied to the board. Therefore, even in the case of the board in which warpage occurs, the conductive ball may be mounted in a state in which the warpage is compensated by the load of the mask 110.

In addition, according to the preferred embodiment of the present invention, in the conductive ball mounting device 100, the mask 110 may have elasticity and the length that the side frame 123 is inserted into the upper frame 121 and the position of the mask frame 140 may be changed as shown in FIG. 2. As shown in FIG. 2, when the side frame 123 is further inserted into the upper frame 121 or the mask frame 140 is moved in the upper direction, the mask 110 may be stretched by the porous member 150 so as not to be moved in the upper direction. Therefore, in the case in which deformation such as the stretch of the board is generated through several processes, a scale compensation deforming the mask 110 may be performed accordingly. Since the scale compensation for the mask 110 may be performed according to the deformation of the board, a matching degree between the board and the mask may be improved. As a result, defect caused at the time in which the conductive ball is mounted on another position other than a pad of the board may be decreased by the conductive ball mounting device 100 according to the preferred embodiment of the present invention.

The conductive ball mounting device 100 according to the preferred embodiment of the present invention may use both the change of the length that the side frame 123 is inserted into the upper frame 121 and the position change of the mask frame 140 for the scale compensation of the mask 110, but the present invention is not limited thereto. That is, the conductive ball mounting device 100 may be formed to use only one of the two methods described above.

FIGS. 3 to 6 are illustrative views showing a method of mounting a conductive ball on a board using the conductive ball mounting device according to a preferred embodiment of the present invention.

Figure 3:
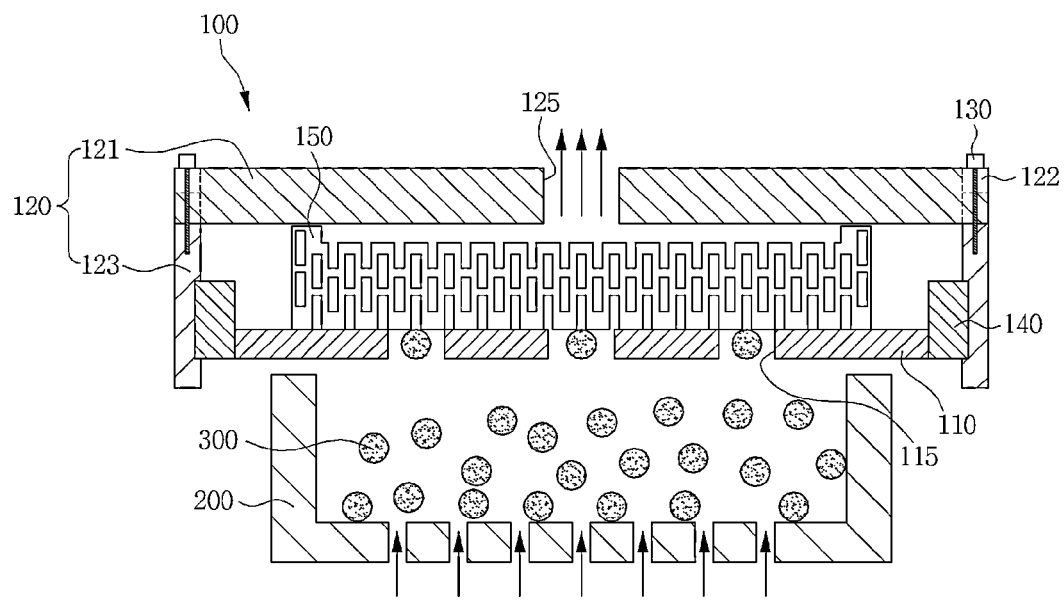
FIGS. 3 to 6 are illustrative views showing a method of mounting a conductive ball on a board using the conductive ball mounting device according to a preferred embodiment of the present invention.

Referring to FIG. 3, the conductive ball mounting device 100 may absorb conductive balls 300 stored in the storing device 200. According to the preferred embodiment of the present invention, the conductive ball 300 may be formed to include solder such as a solder ball. However, a material of the conductive ball 300 is not limited to the solder and any material among conductive materials used in a field of circuit board may be used.

According to the preferred embodiment of the present invention, the conductive ball mounting device 100 may be positioned on the storing device 200. The conductive ball mounting device 100 may absorb the conductive balls 300 in the storing device 200 while inner gas is exhausted through the vacuum hole 125. The vacuum force generated from the conductive ball mounting device 100 may be delivered to the conductive balls 300 through the opening 115 of the mask 110. Therefore, the conductive balls 300 may be absorbed in a state in which they are positioned in the opening 115 of the mask 110. In addition, since the thickness of the mask 110 is the diameter or more of the conductive ball 300 and the size of the opening 115 is also larger than the conductive ball 300, the conductive ball 300 may not be protruded from the lower surface of the mask 110.

In this case, the storing device 200 may allow the conductive balls 300 in the storing device 200 to be better absorbed into the conductive ball mounting device 100 by inhaling the gas from a lower direction to an upper direction.

Figure 4:
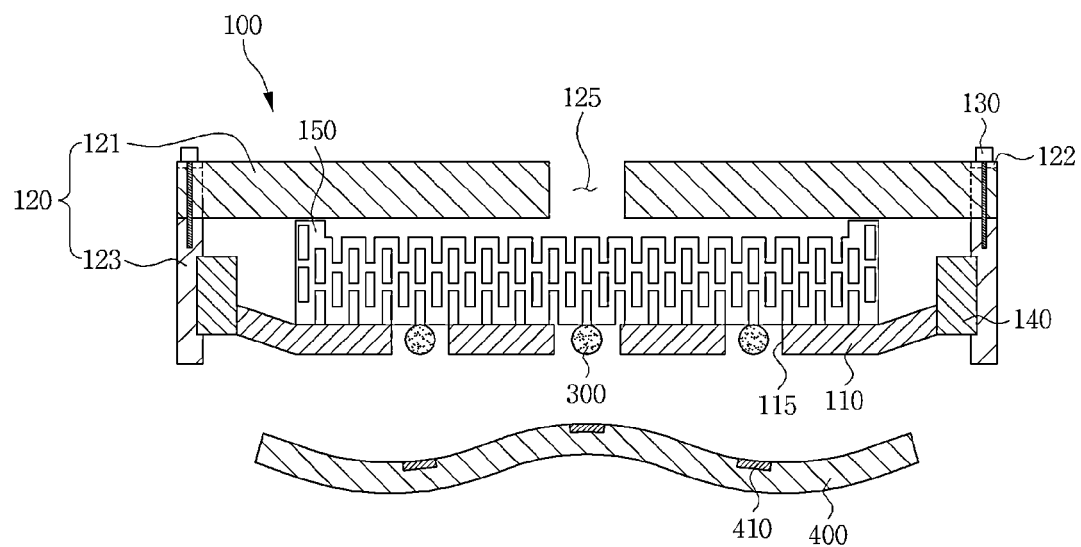

Referring to FIG. 4, the conductive ball mounting device 100 may be moved to an upper portion of a board 400 in a state in which it absorbs the conductive balls 300.

According to an exemplary embodiment of the present invention, the board 400 may be a printed circuit board including an insulating layer and a circuit layer. In addition, the board 400 may be any kind of boards on which the conductive balls 300 may be mounted. The board 400 may be provided with a pad 410 on which the conductive balls 300 are mounted. In addition, the pad 410 of the board 400 may be optionally in a state in which flux is applied.

For example, the board 400 may be in a state in which warpage or stretched deformation occurs through previous several processes. In this case, the conductive ball mounting device 100 may deform the mask 110 according to the deformation of the board 400 by changing the length that the side frame 123 is inserted into the upper frame 121 or changing the position of the mask frame 140.

Although the conductive ball mounting device 100 performs the scale compensation deforming the mask 110 after it absorbs the conductive balls 300 in the preferred embodiment of the present invention, the present invention is not limited thereto. The conductive ball mounting device 100 may perform the scale compensation of the mask 110 in any step as long as the conductive ball 300 is not yet mounted on the board 400. For example, the conductive ball mounting device 100 may perform the scale compensation of the mask 110 before absorbing the conductive balls 300 of FIG. 3.

Figure 5:
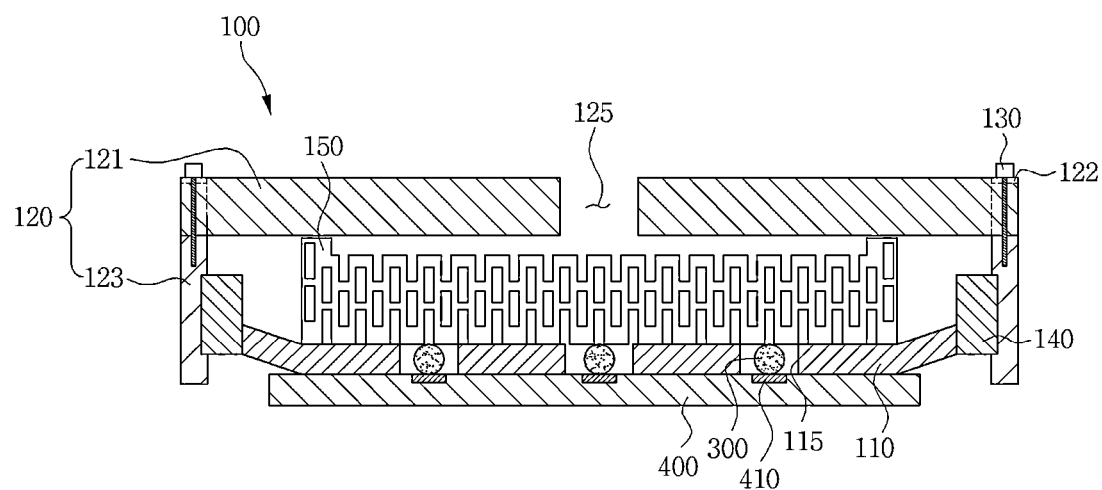

Referring to FIG. 5, the conductive ball mounting device 100 may mount the conductive balls 300 on the board 400.

According to the preferred embodiment of the present invention, the conductive ball mounting device 100, which is in a state absorbing the conductive balls 300, may be moved to contact an upper surface of the board 400. In this case, the scale of the mask 110 of the conductive ball mounting device 100 is compensated, such that the opening 115 of the mask 110 and the pad 410 of the board 400 may be positioned to be matched to each other.

According to the preferred embodiment of the present invention, in the conductive ball mounting device 100, since the conductive balls 300 is positioned in the opening 115 of the mask 110, the lower surface of the mask 110 and the upper surface of the board 400 may be in contact with each other. In addition, the conductive ball mounting device 100 contacting the board 400 may apply the load to the board 400 to compensate for the warpage of the board 400.

The conductive ball mounting device 100 may inhale the gas thereinto in a state in which the warpage of the board 400 is compensated to desorb the conductive balls 300 from the mask 110. The conductive balls 300 may be desorbed from the mask 110 and mounted on the pad 410 of the board 400.

As such, the conductive ball mounting device 100 may improve the matching degree between the mask 110 and the board 400 by the scale compensation of the mask 110 and the warpage compensation of the board 400. As a result, a matching degree between the conductive balls 300 and the pad 410 of the board 400 may also be improved.

Figure 6:
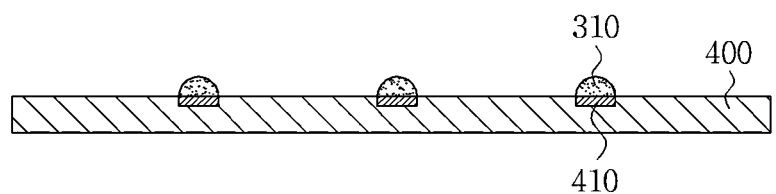

Referring to FIG. 6, a conductive bump 310 may be formed on the board 400.

The conductive ball mounting device (100 in FIG. 5) according to the preferred embodiment of the present invention may be separated from the board 400 after the conductive balls (300 in FIG. 5) are mounted on the board 400. In this case, the board 400 may be pressed by the conductive ball mounting device (100 in FIG. 5) to be in a state in which the warpage of the board 400 is compensated.

Thereafter, a reflow process is performed on the board 400 and the conductive balls (300 in FIG. 5) may become the conductive bumps 310.

In the case in which the conductive balls 300 are mounted on the board 400 using the conductive ball mounting device 100 according to the preferred embodiment of the present invention, the matching degree between the conductive balls 300 and the board 400 may be improved. Therefore, the defects caused at the time in which the conductive balls 300 are mounted on regions other than the pad 410 of the board 400 may be decreased.

According to the preferred embodiment of the present invention, the conductive ball mounting device has the conductive ball mounted thereon in a state in which the warpage of the board is improved, thereby making it possible to improve the match between the pad of the board and the conductive ball.

According to the preferred embodiment of the present invention, the conductive ball mounting device performs the scale correction deforming the mask according to the deformation of the board, thereby making it possible to improve the match between the pad of the board and the conductive ball.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A conductive ball mounting device for mounting a conductive ball on a printed circuit board comprising:

a mask having a thickness equal to or larger than a diameter of a conductive ball and having an opening formed in the mask and configured to be in contact with a printed circuit board so as to mount the conductive ball on the printed circuit board, wherein the conductive ball is absorbed and desorbed into and from the opening;

a frame having a vacuum hole formed in the frame and formed to enclose sides and an upper portion of the mask; and a porous member formed between the frame and the upper portion of the mask, wherein the opening has a width and a depth equal to or larger than the diameter of the conductive ball, wherein the vacuum hole and the opening are connected with each other through the porous member, and wherein the frame includes:

an upper frame positioned on the mask; and a side frame positioned at the side of the mask and having an upper half coupled to the upper frame to support the upper frame.

2. The conductive ball mounting device as set forth in claim 1, further comprising a fixing member penetrating through the upper frame in a thickness direction and fixing the upper frame and the side frame in a state in which they are coupled to each other by inserting one end penetrating through the upper frame into the upper half of the side frame.

3. The conductive ball mounting device as set forth in claim 1, wherein a height of the frame is changed depending on an insertion length of the side frame inserted into the upper frame.

4. The conductive ball mounting device as set forth in claim 1, further comprising a mask frame having one side coupled to the side frame and the other side coupled to the side of the mask to connect the mask and the frame to each other.

5. The conductive ball mounting device as set forth in claim 4, wherein the mask frame is moved along the coupled side frame.

6. The conductive ball mounting device as set forth in claim 1, wherein the mask has elasticity.

7. The conductive ball mounting device as set forth in claim 1, wherein the mask is made of a metal material having elasticity.

8. The conductive ball mounting device as set forth in claim 1, wherein the porous member is fixed on a lower surface of the upper frame and is in contact with an upper surface of the mask.

\* \* \* \* \*